(12) United States Patent
Katou et al.

(10) Patent No.: US 8,946,889 B2
(45) Date of Patent: Feb. 3, 2015

(54) SEMICONDUCTOR MODULE WITH COOLING MECHANISM AND PRODUCTION METHOD THEREOF

(71) Applicant: Denso Corporation, Kariya (JP)

(72) Inventors: Chikage Katou, Aichi-ken (JP); Hiroaki Arai, Nagoya (JP); Yoshiyuki Yamauchi, Aichi-ken (JP); Yasuou Yamazaki, Nagoya (JP); Naoki Sugimoto, Anjo (JP); Yasuyuki Sakai, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 14/070,689

(22) Filed: Nov. 4, 2013

(65) Prior Publication Data
US 2014/0091452 A1    Apr. 3, 2014

Related U.S. Application Data

(62) Division of application No. 13/167,144, filed on Jun. 23, 2011, now abandoned.

(30) Foreign Application Priority Data

Jun. 23, 2010 (JP) .................................. 2010-143057

(51) Int. Cl.
    *H01L 23/34*    (2006.01)
(52) U.S. Cl.
    USPC .......................................... 257/713; 257/714
(58) Field of Classification Search
    USPC .................. 257/706, 712, 713, 714, E21.499, 257/E23.08
    See application file for complete search history.

(56) References Cited

U.S. PATENT DOCUMENTS

| 7,944,045 | B2 | 5/2011 | Noritake et al. |
| 8,125,781 | B2 | 2/2012 | Mamitsu et al. |
| 2006/0096299 | A1* | 5/2006 | Mamitsu et al. ................. 62/3.2 |
| 2009/0224398 | A1* | 9/2009 | Noritake et al. ............. 257/707 |
| 2012/0119347 | A1 | 5/2012 | Mamitsu et al. |

FOREIGN PATENT DOCUMENTS

| JP | P2005-079386 A | 3/2005 |
| JP | P2005-123233 A | 5/2005 |
| JP | P2006-165534 A | 6/2006 |
| JP | 4225310 | 12/2008 |
| JP | P2008-294196 A | 12/2008 |
| JP | P2009-212302 A | 9/2009 |
| JP | P2010-135697 A | 6/2010 |

OTHER PUBLICATIONS

Japanese Official Action dated Oct. 16, 2012 issued in corresponding Japanese Application No. 2010-143057, with English translation.

* cited by examiner

*Primary Examiner* — Hung Vu
(74) *Attorney, Agent, or Firm* — Nixon & Vanderhye P.C.

(57) ABSTRACT

A semiconductor module is provided which includes a semiconductor unit which is made by a resin mold. The resin mold has formed therein a coolant path through which a coolant flows to cool a semiconductor chip embedded in the resin mold. The resin mold also includes heat spreaders, and electric terminals embedded therein. Each of the heat spreaders has a fin heat sink exposed to the flow of the coolant. The fin heat sink is welded to a surface of each of the heat spreaders through an insulator, thus minimizing an electrical leakage from the heat spreader to the coolant.

4 Claims, 10 Drawing Sheets

COOLANT IN

COOLANT OUT

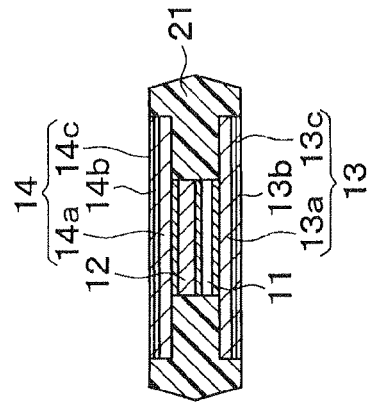
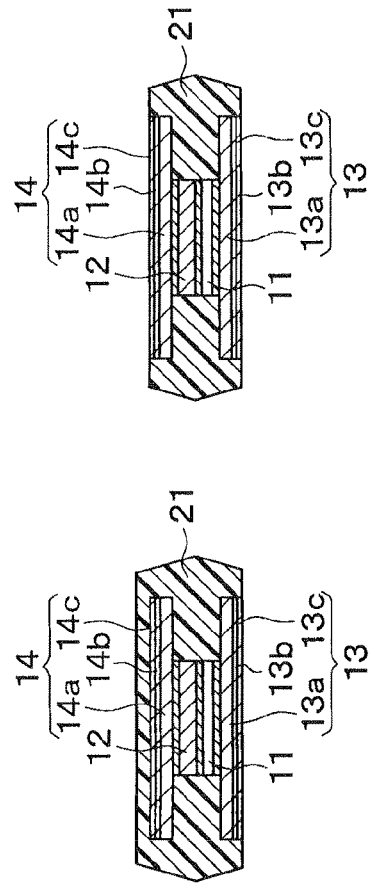
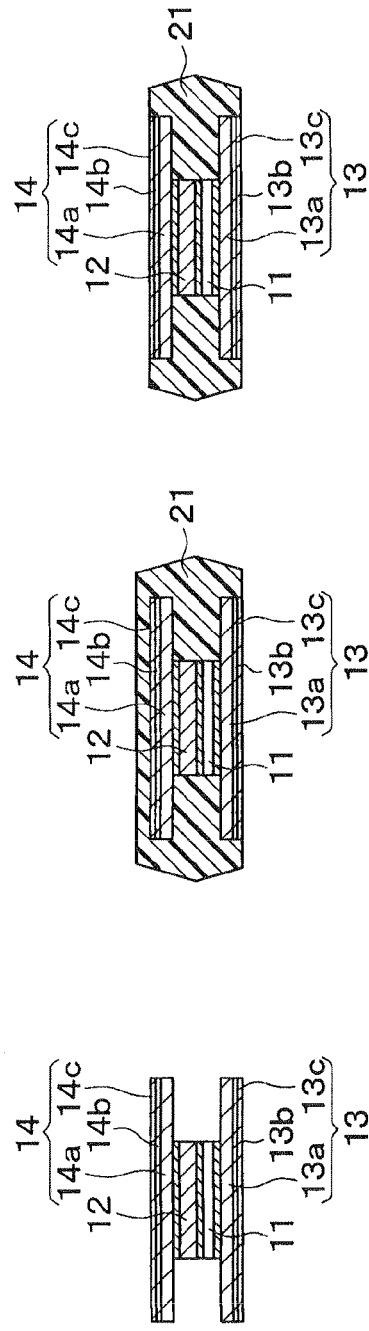
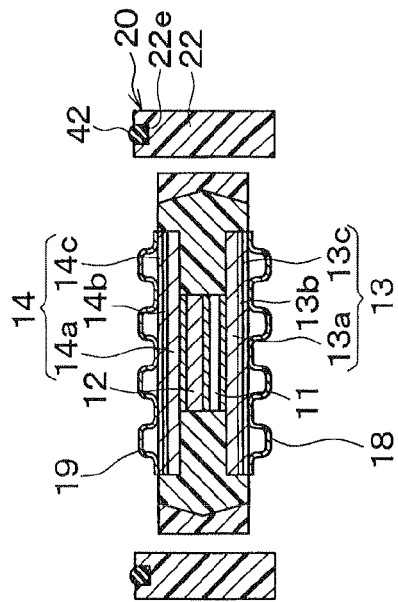
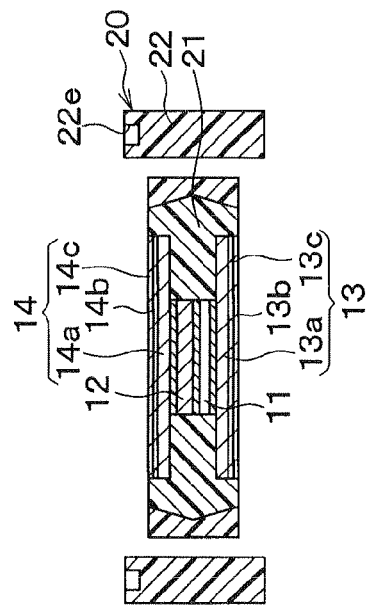

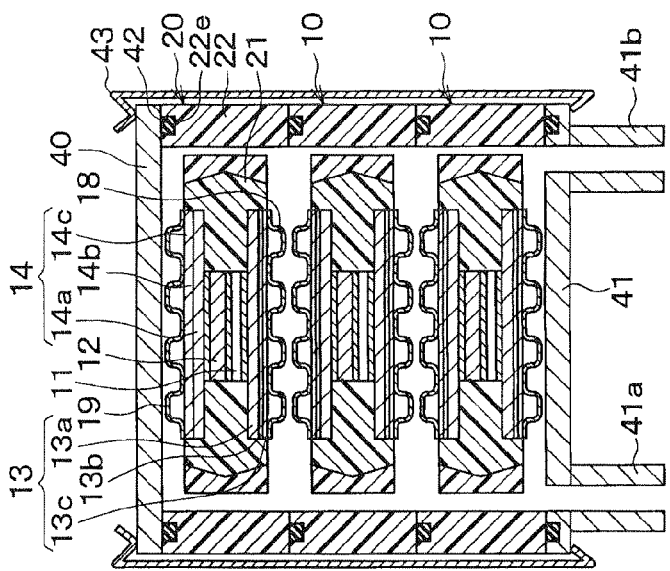
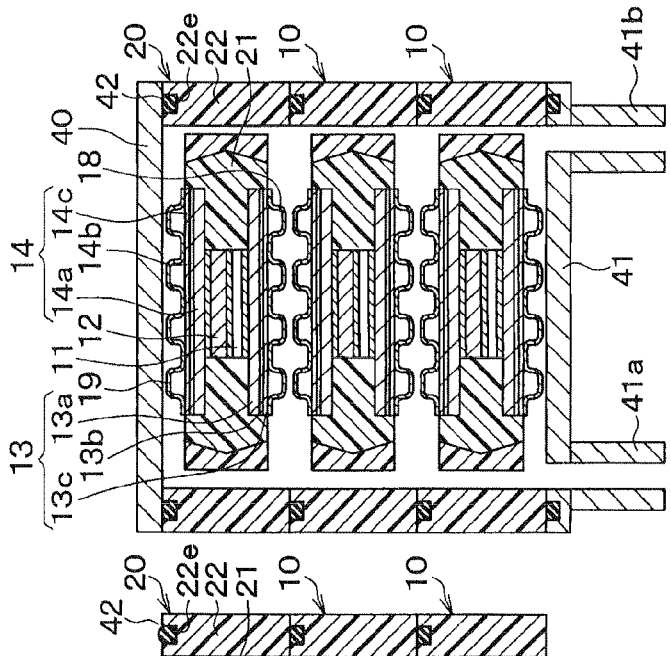
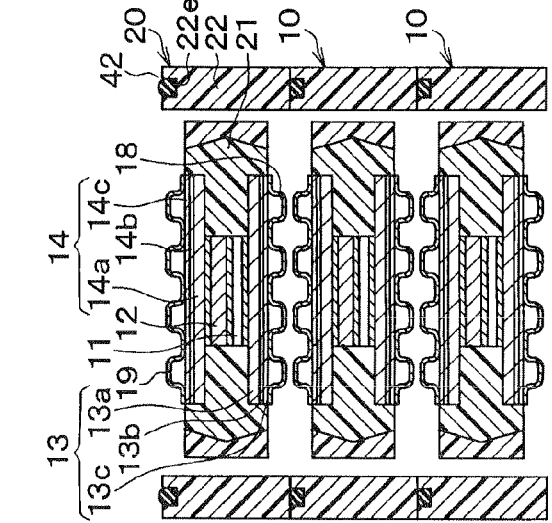

SEMICONDUCTOR MODULE WITH COOLING MECHANISM AND PRODUCTION METHOD THEREOF

CROSS REFERENCE TO RELATED DOCUMENT

This application is a Divisional of U.S. application Ser. No. 13/167,144, filed Jun. 23, 2011, which claims priority to Japanese Application No. 2010-143057, filed Jun. 23, 2010, the entire contents of each of which are hereby incorporated by reference.

BACKGROUND OF THE INVENTION

1 Technical Field

The present invention relates generally to a semiconductor module which includes a resin molded package equipped with a power semiconductor chip and a heat spreader working to spread heat from the power semiconductor chip and which may be of a 1-in-1 structure into which a single power semiconductor chip(s) such as an IGBT or a power MOSFET for use as either of an upper arm (i.e., a high side device) or a lower arm (i.e., a low side device) of an inverter is resin-molded, or a 2-in-1 structure into which two power semiconductor chips for use as the upper and lower arms, respectively, are resin-molded. The present invention also relates to a production method of such a semiconductor module.

2 Background Art

One of typical semiconductor modules is equipped with a resin molded package in which a semiconductor chip(s) with a semiconductor power device and heat spreaders serving to dissipate heat, as generated by the semiconductor power device, are disposed. Some of such a type of semiconductor modules are also equipped with a fin heat sink formed integrally with each of the heat spreaders in order to enhance dissipation of the heat generated by the semiconductor power device. The heat spreader is so installed as to expose the fin heat sink to a cooling fluid such as water fed from a cooling mechanism installed in the semiconductor module to transfer the heat to the cooling fluid.

Japanese Patent First Publication No. 2006-165534 discloses heat spreaders which are so disposed as to face each other. Coolant flows between the heat spreaders to cool semiconductor power devices. In order to enhance such cooling efficiency, the heat spreaders have irregularities formed facing surfaces thereof which work as fin heat sinks. All the heat spreaders and the cooling fins are made of metal, which may result in electrical leakage between the facing surfaces of the heat spreaders.

In order to achieve a high degree of the cooling efficiency of the heat spreaders and the electrical insulation between the spreaders at the same time, it is effective to form insulating films on the fin heat sinks. A difficulty is, however, encountered in forming the insulating films on the uneven surface of the fin heat sinks. Such formation may be achieved in the vapor phase epitaxial method such as spattering, CVD, or spray coating. It is, however, difficult for such a method to achieve a constant thickness of coating of insulator between fins of the fin heat sink, which may lead to the leakage of electricity from the heat spreader.

To integrate the heat spreader and the fin heat sink, it is usually made by shaving, casting, or extrusion. These methods difficulty in fabricating the pitched fine fins of the fin heat sink and ensuring a desired size of the area of the fin heat sink from which the heat is dissipated.

SUMMARY

It is therefore an object to provide an improved structure of a semiconductor module which includes a heat spreader equipped with a fin heat sink and which is designed to minimize an electrical leakage from the heat spreader, and a production method thereof.

According to one aspect of an embodiment, there is provided a semiconductor module which may be employed with an inverter for an electric motor. The semiconductor module comprises: (a) a resin molded package; (b) first and second insulating films; (c) first and second fin heat sinks; (d) a first cover; (e) a second cover; and (f) a fastener. The resin molded package includes a resin mold. The resin mold has embedded therein a power semiconductor chip which has a first and a second surface opposite each other and on which a semiconductor power device is fabricated, a first heat spreader, a second heat spreader, and electric terminals coupled electrically with the semiconductor power device. The first heat spreader has a first surface and a second flat surface opposed to the first surface and is disposed at the first surface thereof in connection with the first surface of the power semiconductor chip. The second heat spreader has a first surface and a second flat surface opposed to the first surface and is disposed at the first surface thereof in connection with the second surface of the power semiconductor chip. A portion of each of the electric terminals is exposed outside the resin mold. The resin mold also has formed therein a coolant path that is a portion of a coolant path through which a coolant flows to cool the power semiconductor chip. The first and second insulating films are disposed over the second flat surfaces of the first and second heat spreaders, respectively. The first and second fin heat sinks are joined to the first and second insulating films, respectively. The first cover is disposed on a first surface of the resin molded package. The second cover is disposed on a second surface of the resin molded package. The fastener fastens the first and second covers to hold the resin molded package.

Specifically, the first and second fin heat sinks are formed separately from of the first and second heat spreaders, respectively, thus facilitating ease of machining the first and second fin heat sinks to have a complex shape. The first and second fin heat sinks are welded to the first and second heat spreaders through the first and second insulating films, thus facilitating ease of forming the first and second insulating films to have a constant thickness on the flat second surfaces of the first and second heat spreaders. The first and second insulating films serve to eliminate the electrical leakage from the first and second heat spreaders.

In the preferred mode of the embodiment, the resin mold has formed therein positioning recesses which are shaped to conform with contour of the first and second fin heat sinks and serve to position the first and second fin heat sinks. This facilitates placement of the first and second fin heat sinks onto the resin mold when the first and second fin heat sinks are to be welded to the first and second heat spreaders, respectively.

The first heat spreader may be equipped with a first metal plate disposed on the power semiconductor chip, the first insulating film is disposed on a surface of the first metal plate that is the second surface of the first heat spreader, and a first metal film disposed on the first insulating film and electrically kept away from the first metal plate. Similarly, the second heat spreader may be equipped with a second metal plate disposed on the power semiconductor chip, the second insulating film disposed on a surface of the second metal plate that is the second surface of the second heat spreader, and a second metal film disposed on the second insulating film and electrically kept away from the second metal plate. The first and second fin heat sinks are welded to the first and second metal films, respectively.

The first and second fin heat sinks may be attached to the second flat surfaces of the first and second heat spreaders through first and second adhesive layers, respectively. The first and second adhesive layers are made of an insulating material and form the first and second insulating films, respectively. The first and second heat spreaders are made of the same material as that of the first and second fin heat sinks, thus resulting in a decrease in stress acting on the adhesive layers which will arise from a change in temperature therebetween.

According to another aspect of an embodiment, there is provided a semiconductor module which comprises: (a) a resin molded package which includes a resin mold; (b) first and second fin heat sinks; (c) a first cover; (d) a second cover; and (e) a fastener. The resin mold has embedded therein a power semiconductor chip which has a first and a second surfaces opposed to each other and on which a semiconductor power device is fabricated, a first heat spreader, a second heat spreader, and electric terminals coupled electrically with the semiconductor power device. The first heat spreader has a first surface and a second flat surface opposed to the first surface and is disposed at the first surface thereof in connection with the first surface of the semiconductor chip. The second heat spreader has a first surface and a second flat surface opposed to the first surface and is disposed at the first surface thereof in connection with the second surface of the semiconductor chip. A portion of each of the electric terminals is exposed outside the resin mold. The resin mold also has formed therein a coolant path that is a portion of a coolant path through which a coolant flows to cool the semiconductor chip. The first and second fin heat sinks are joined to the second flat surfaces of the first and second heat spreaders through first and second adhesive layers, respectively. The first and second adhesive layers are made of material exhibiting electric conductivity. The first cover is disposed on a first surface of the resin molded package. The second cover is disposed on a second surface of the resin molded package. The fastener fastens the first and second covers to hold the resin molded package.

According to the third aspect of the embodiment, there is provided a semiconductor module which comprises: (a) a plurality of resin molded packages each of which includes a resin mold; (b) first and second insulating films; (c) first and second fin heat sinks; (d) a first cover; (e) a second cover; and (f) a fastener. The resin molded packages are laid to overlap each other as a package stack. The resin mold has embedded therein a power semiconductor chip which has a first and a second surface opposed to each other and on which a semiconductor power device is fabricated, a first heat spreader, a second heat spreader, and electric terminals coupled electrically with the semiconductor power device. The first heat spreader has a first surface and a second flat surface opposed to the first surface and is disposed at the first surface thereof in connection with the first surface of the power semiconductor chip. Similarly, the second heat spreader has a first surface and a second flat surface opposed to the first surface and is disposed at the first surface thereof in connection with the second surface of the power semiconductor chip. A portion of each of the electric terminals is exposed outside the resin mold. The resin mold also has formed therein a coolant path that is a portion of a coolant path through which a coolant flows to cool the power semiconductor chip. The first and second insulating films are disposed over the second flat surfaces of the first and second heat spreaders of each of the resin molded packages, respectively. The first and second fin heat sinks are joined to the first and second insulating films of each of the resin molded packages, respectively, so that adjacent two of the resin molded packages are arranged to have the first and second fin heat sink facing one another. The first cover is disposed on a first surface of the package stack. The second cover is disposed on a second surfaced of the package stack. The fastener fastens the first and second covers to hold the package stack.

Specifically, the first and second insulating films serve to avoid an electrical short between the first and second fin heat sinks of adjacent two of the resin molded packages.

In the preferred mode of the embodiment, each of the first and second fin heat sinks may be equipped with corrugated arrays of fins. The fins of the first fin heat sink of one of adjacent two of the resin molded packages are arrayed 180° out of phase with the fins of the second fin heat sink of the other of adjacent two of the resin molded packages. This creates lots of turbulent or eddy flows of the coolant within the coolant path, thus enhancing the cooling ability of the heat spreaders.

Each of the first and second fin heat sinks may alternatively be equipped with an array of straight strips which define fins. The fins of the first fin heat sink of one of adjacent two of the resin molded packages are aligned with the fins of the second fin heat sink of the other of adjacent two of the resin molded packages through a gap in a direction in which the resin molded packages are laid to overlap each other as the package stack.

Each of the first and second fin heat sinks may alternatively be equipped with an array of straight strips which define fins. Tops of the fins of the first fin heat sink of one of adjacent two of the resin molded packages overlap tops of the fins of the second fin heat sink of the other of adjacent two of the resin molded packages in a direction perpendicular to a direction in which the resin molded packages are laid to overlap each other as the package stack.

Each of the first and second fin heat sinks may alternatively be equipped with a plurality of pins which define fins. Tops of the fins of the first fin heat sink of one of adjacent two of the resin molded packages overlap tops of the fins of the second fin heat sink of the other of adjacent two of the resin molded packages in a first direction perpendicular to a second direction in which the resin molded packages are laid to overlap each other as the package stack. The fins of the first fin heat sink of one of adjacent two of the resin molded packages are staggered to the fins of the second fin heat sink of the other of adjacent two of the resin molded packages in the first direction.

Each of the first and second fin heat sinks may alternatively be equipped with a plurality of pairs of arrays of pins which define fins. Tops of the fins of the first fin heat sink of one of adjacent two of the resin molded packages overlap tops of the fins of the second fin heat sink of the other of adjacent two of the resin molded packages in a first direction perpendicular to a second direction in which the resin molded packages are laid to overlap each other as the package stack. The pairs of the arrays of the fins of the first fin heat sink of one of adjacent two of the resin molded packages are staggered to the pairs of the arrays of the fins of the second fin heat sink of the other of adjacent two of the resin molded packages in the first direction. This arrangement of the fins provides lots of obstructions to the flow of the coolant, thus creating lots of turbulent or eddy flows of the coolant within the coolant path, thus enhancing the cooling ability of the heat spreaders.

According to fourth aspect of the embodiment, there is provided a method of producing a semiconductor module which includes a resin molded package and a coolant path. The production method comprises: (a) a first step of preparing a semiconductor sub-assembly of a semiconductor chip, a first heat spreader, a second heat spreader, and electric terminals, the semiconductor chip having a first and a second surface opposed to each other and being equipped with a semiconductor power device connecting with the electric terminals; (b) a second step of placing the semiconductor sub-assembly in a given molding tool and making a resin mold in which the semiconductor sub-assembly is disposed as the resin molded package, the first heat spreader having a first surface and a second flat surface opposed to the first surface and being disposed at the first surface thereof in connection with the first surface of the power semiconductor chip, the second heat spreader having a first surface and a second flat surface opposed to the first surface and being disposed at the first surface thereof in connection with the second surface of the power semiconductor chip, a portion of each of the electric terminals being exposed outside the resin mold, the resin mold also having formed therein a coolant path that is a portion of a coolant path through which a coolant flows to cool the power semiconductor chip; and (c) a third step of holding the resin molded package through covers to complete the semiconductor module.

The first heat spreader has a first metal plate disposed on the power semiconductor chip, the first insulating film disposed on a surface of the first metal plate that is the second surface of the first heat spreader, and a first metal film disposed on the first insulating film and electrically kept away from the first metal plate. Similarly, the second heat spreader has a second metal plate disposed on the power semiconductor chip, the second insulating film disposed on a surface of the second metal plate that is the second surface of the second heat spreader, and a second metal film disposed on the second insulating film and electrically kept away from the second metal plate. The first and second fin heat sinks are joined to the first and second metal films, respectively, through ultrasonic welding.

Specifically, the first and second fin heat sinks are formed separately from the first and second heat spreaders, respectively, thus facilitating ease of machining the first and second fin heat sinks to have a complex shape. The first and second fin heat sinks are joined to the first and second heat spreaders through the first and second insulating films, thus facilitating ease of forming the first and second insulating films to have a constant thickness on the flat second surfaces of the first and second heat spreaders. The first and second insulating films serve to eliminate the electrical leakage from the first and second heat spreaders.

In the preferred mode of the embodiment, the second step forms the resin mold so as to cover the semiconductor sub-assembly fully and then removes a portion of the resin mold so as to expose one of the first and second metal films.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIGS. 4(a), 4(b), 4(c), 4(d), and 4(e) are cross sectional views which demonstrate a sequence of steps of producing the resin molded package, as illustrated in FIGS. 2(a) to 2(c);

FIGS. 5(a), 5(b), and 5(c) are cross sectional views which demonstrate a sequence of steps of assembling the semiconductor module, as illustrated in FIG. 1;

DESCRIPTION OF THE PREFERRED EMBODIMENTS

Figure 1:
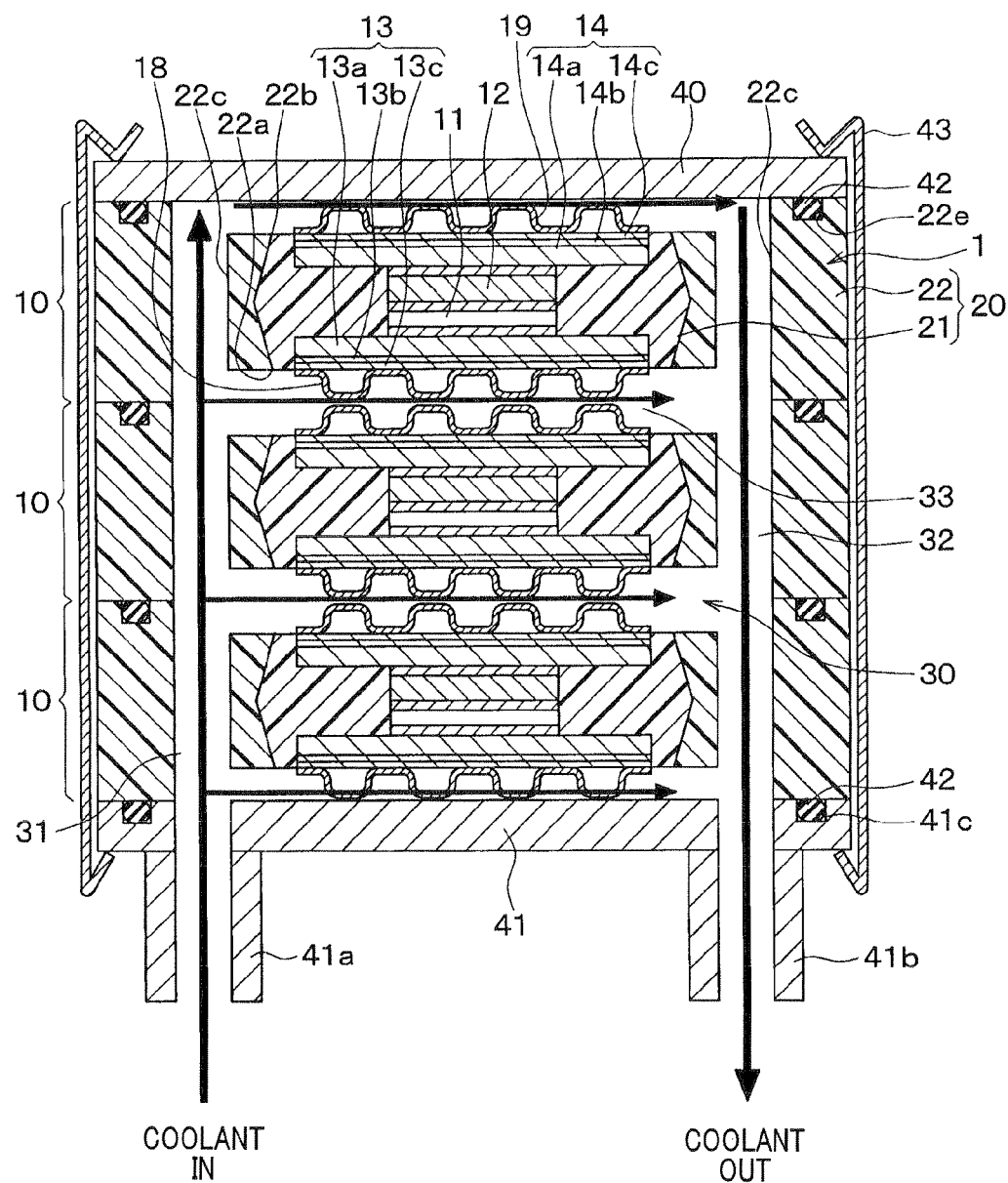
FIG. 1 is a vertical sectional view which shows a semiconductor module according to the first embodiment.

Referring to the drawings, wherein like reference numbers refer to like parts in several views, there is shown a semiconductor module 1 with a cooling mechanism according to the first embodiment. The semiconductor module 1 is used with, for example, an inverter to drive a three-phase electric motor for automotive vehicles.

FIG. 1 is a vertical cross sectional front view which illustrates the semiconductor module 1. The semiconductor module 1 includes a stack of resin molded packages 10. Each of the resin molded packages 10 is equipped with a power semiconductor chip 11. The resin molded packages 10 are substantially identical in structure with each other, and the following discussion will be referred to only one of the resin molded packages 10 for the simplicity of disclosure.

Figure 2A:
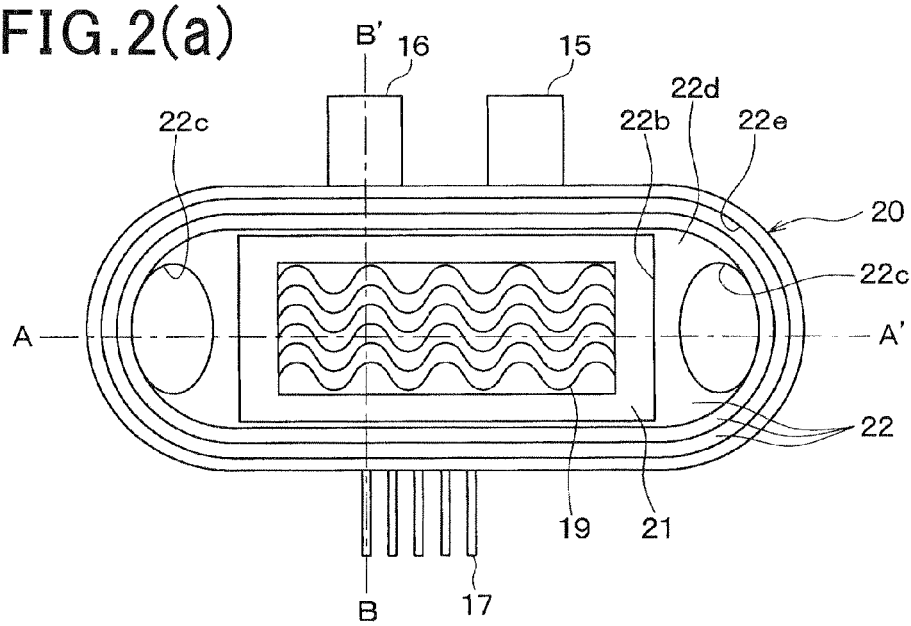
FIG. 2(a) is a plane view which shows one of resin molded packages built in the semiconductor module of FIG. 1.
Figure 2B:
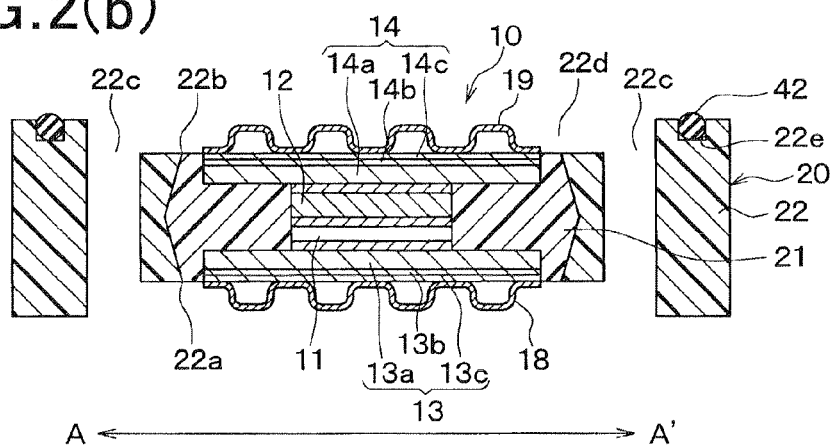
FIG. 2(b) is a cross sectional view, as taken along the line A-A' of FIG. 2(a)
Figure 2C:
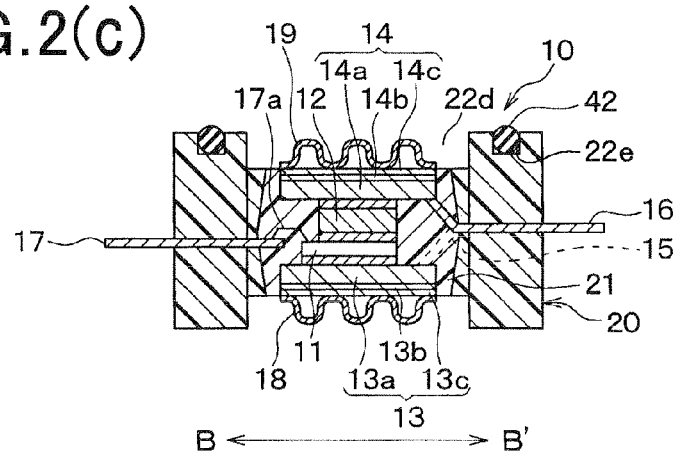
FIG. 2(c) is a cross sectional view, as taken along the line B-B' of FIG. 2(a)

FIGS. 2(a) to 2(c) illustrate the structure of the resin molded package 10. FIG. 2(a) is a front view of the resin molded package 10. FIG. 2(b) is a cross sectional view, as taken along the line A-A' of FIG. 2(a). FIG. 2(c) is a cross sectional view, as taken along the line B-B' of FIG. 2(c).

The resin molded package 10 also includes a metal block 12, heat spreaders 13 and 14, a positive electric terminal 15, a negative electric terminal 16, and signal terminals 17. The power semiconductor chip 11, the metal block 12, the heat spreaders 13 and 14, the positive electric terminal 15, the negative electric terminal 16, and the signal terminals 17 are molded by resin into a single resin mold assembly 20 as the resin molded package 10. The resin mold assembly 20 will also be referred to as a resin mold below. The resin molded package 10 is also equipped with fin heat sinks 18 and 19 to enhance dissipation of heat from the heat spreaders 13 and 14. The resin molded package 10 is of a 1-in-1 structure equipped with the single power semiconductor chip 11, but may alternatively be designed to have two or more power semiconductor chips 11. For example, the semiconductor unit 10 may be made as a 2-in-1 structure with two semiconductor chips 11 working as an upper and a lower arm of an inverter or as a 3-in-1 structure with three semiconductor chips 11 working as an upper arm or a low arm for three phases of an inverter.

The semiconductor chip 11 has mounted thereon the semiconductor power device such as an IGBT or a power MOSEFT.

In the case where the power semiconductor chip 11 is equipped with an IGBT, it includes an accompanying freewheeling diode (FWD) either connected anti-parallel to the IGBT or built into the IGBT itself. While in the case of a power MOSFET, it has a built-in anti-parallel diode, thus does not usually need an additional FWD. In this embodiment, the power semiconductor chip 11 is equipped with a semiconductor power device such as an IGBT which is of a vertical type in which electric current flows in a thickness-wise direction thereof. The power semiconductor device of the power semiconductor chip 11 is fabricated from a semiconductor substrate, and the top surface usually receives greater number of processes to become the negative side of a semiconductor chip, that is, the emitter for an IGBT and the source for a power MOSFET, which occupies the greatest area of the device. The top surface also has control and sensing terminals formed as pads. The entire area of the bottom surface of the device 11 becomes the positive side of the switch, that is, the collector for an IGBT and the drain for a power MOSFET.

The semiconductor unit 10, as illustrated in FIGS. 2(a) to 2(c), is of a single chip structure, but may alternatively be engineered to have two chips: an active power device such as IGBT and an FWD. The power semiconductor chip 11 may have a horizontal type power semiconductor chip in which the current flows in a lateral direction of a substrate thereof.

The metal block 12 is made of a metal material such as copper or aluminum which has a high thermal conductivity. The metal block 12 is glued or soldered mechanically and electrically to the pad which is formed on the first surface of the power semiconductor chip 11 and connected to the emitter of the IGBT. The metal block 12 is disposed on the first surface of the power semiconductor chip 11 to secure an interval between the first surface of the power semiconductor chip 11 and the heat spreader 14.

Each of the heat spreaders 13 and 14 conducts heat generated in the power semiconductor chip 11 to be diffused widely. The heat spreader 13 is also joined mechanically and electrically to the pad on the second surface of the power semiconductor chip 11 and additionally serves as an electric lead coupled with the collector of the IGBT. The heat spreader 14 is secured mechanically and electrically to the metal block 12 and additionally serves as an electric lead coupled with the emitter of the IGBT. The surface of each of the heat spreaders 13 and 14 which is farther away from the power semiconductor chip 11 is not covered with the material of the resin mold assembly 20 and has affixed thereto a corresponding one of the fin heat sinks 18 and 19 exposed to a coolant such as water flowing therethrough.

The heat spreaders 13 and 14 also have installed thereon insulators, respectively, in order to keep the heat spreaders 13 and 14 of adjacent two of the resin molded packages 10 from short-circuiting therebetween through the coolant and are engineered to enable the fin heat sinks 18 and 19 to be attached thereto. Specifically, the heat spreader 13 includes a metal plate 13a, an insulating film 13b, and a metal film 13c. Similarly, the heat spreader 14 includes a metal plate 14a, an insulating film 14b, and a metal film 14c.

The metal plates 13a and 14a each function as a heat sink and a portion of an electric current flow path. Each of the metal plates 13a and 14a is made of metal such as copper that is high in thermal and electric conductivity and formed by an approximately square metal plate of a given thickness. The insulating films 13b and 14b are affixed to the surfaces of the metal plates 13a and 14a which are farther away from the power semiconductor chip 11. The insulating films 13b and 14b are made of an insulating material such as alumina and formed by means of a vapor phase epitaxial method such as spattering, CVD, or spray coating. The surfaces of the metal plates 13a and 14a on which the insulating films 13b and 14b are to be formed are even without any irregularities, so that the thickness of the insulating films 13b and 14b is substantially constant. The metal films 13c and 14c are made of the same metal material as that of the fin heat sinks 18 and 19 or a metal material that is excellent at adhesion to the material of the fin heat sinks 18 and 19. The metal films 13c and 14c are made of, for example, aluminum. For the reasons, as described later, the thickness of the metal films 13c and 14c is determined in light of an inclination of the heat spreaders 13 and 14, in other words, an error in height thereof when the components thereof are stacked in layers.

The insulating films 13b and 14b are located closer to the coolant than the metal plates 13a and 14b which electrically connect to the power semiconductor chip 11, thereby ensuring electric insulation of the heat spreaders 13 and 14 from the coolant and avoiding a short-circuit therebetween.

The positive electric terminal 15 is formed integrally with the heat spreader 13 or soldered or welded thereto, so that it is connected electrically to the second surface of the power semiconductor chip 11 which is the positive side of the semiconductor switch. The end of the positive electric terminal 15 is exposed from the resin mold assembly 20 for electric connection with an external circuit.

The negative electric terminal 16 is formed integrally with the heat spreader 14 or soldered or welded thereto, so that it is connected electrically to the pad which is formed on the first surface of the power semiconductor chip 11, which is the negative side of the semiconductor switch. One end of the negative electric terminal 16 which is farther away from the heat spreader 14, is exposed from the resin mold assembly 20 for electric connection with an external circuit.

The signal terminals 17 through which several different kinds of electric signals flow, such as a gate to turn the semiconductor switch on and off, a current monitor, a temperature monitor, and a signal ground. The signal terminals 17 are electrically joined at ends thereof to the pads formed on the first surface of the power semiconductor chip 11 with bonding wires 17a and also exposed at other ends thereof outside the resin mold assembly 20 for electrical connections with an external device. The spacing between the first surface of the power semiconductor chip 11 and the heat spreader 18 is, as described above, created by the metal block 12, thus ensuring the electrical connections of the power semiconductor chip 11 to the signal terminals 17 without physical and electrical interferences of the bonding wires 17a with the heat spreader 14.

Figure 3A:
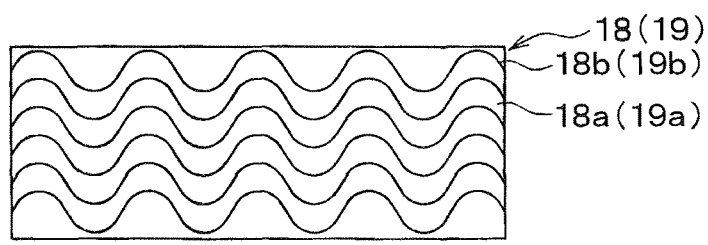
FIG. 3(a) is a front view which schematically illustrates a structure of a fin heat sink of the resin molded package of FIGS. 2(a) to 2(c)
Figure 3B:
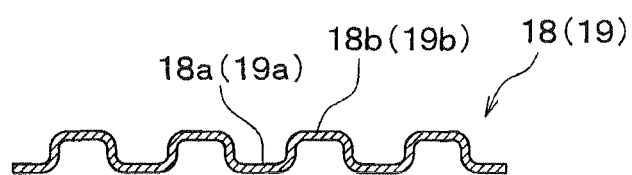
FIG. 3(b) is a cross sectional view of FIG. 3(a)

The fin heat sinks 18 and 19 are joined to the outside surfaces of the heat spreaders 13 and 14, that is, the surfaces of the metal films 13c and 14c by means of the ultrasonic welding. The fin heat sinks 18 and 19 may be of any of known structures and, in this embodiment, is of a waved fin type. FIG. 3(a) is a front view of the fin heat sink 18. FIG. 3(b) is a cross sectional view of FIG. 3(a). The fin heat sink 18 is made of a single plate which is pressed into a corrugated shape in cross section. Six waved lines in FIG. 3(a) represent six fins 18b which extend in a direction along the line A-A' in FIGS. 2(a) and 2(b) and are corrugated in a vertical direction, as viewed in FIG. 3(a), i.e., a direction along the line B-B' in FIGS. 2(a) and 2(c). Every adjacent two of the six fins 18b (i.e., the six waved lines in FIG. 3(a)) define a waved flow path which extends in the lateral direction of the drawing and through which the coolant flows. The six fins 18b have ridges of the same height. FIGS. 3(a) and 3(b) are different in number of the corrugations from each other for the brevity of illustration. The same is true for FIGS. 2(a), 2(b), and 2(c). The fin heat sinks 18 and 19 are identical in structure and operation with each other, and the following explanation will refer only to the fin heat sink 18 for the brevity of disclosure.

Specifically, the fin heat sink 18 includes flat surface areas 18a (i.e., troughs of the corrugations or protrusions, as viewed from the direction along the lines A-A' in FIGS. 2(a) and 2(b)) and the fins 18b. The flat surface areas 18a form the waved flow paths, as described above. The fins 18b increase the entire surface area of the fin heat sink 18 from which the heat is dissipated. The fin heat sink 18 is made of the same metal material as that of the metal films 13c and 14c of the heat spreaders 13 and 14 or a metal material that is excellent at adhesion to the material of the metal films 13c and 14c. The fin heat sink 18 is made of, for example, aluminum.

The formation of the resin mold assembly 20 is made in the following steps. A sub-assembly of components, i.e., the power semiconductor chip 11, the metal block 12, the heat spreaders 13 and 14, the positive electrode lead 15, the negative electrode lead 16, and the control terminals 17 which are to be disposed in the resin molded package 10 and have been connected electrically or mechanically is first prepared. The sub-assembly is then put in a molding tool. Resin is injected into the molding tool. The resin mold assembly 20 is made up of two molds: a body 21 made of thermosetting resin and a shell 22 made of thermoplastic resin. The body 21 made of the thermosetting resin has the above components embedded therein. The shell 22 of thermoplastic resin functions as a frame to surround or wall the periphery of the body 21 of thermosetting resin.

The body 21 is made of thermosetting resin, for example, epoxy, phenol, silicon, or urethane and wraps or insulates the components of the resin molded package 10. The body 21 of thermosetting resin is so shaped as to have the ends of the positive electric terminal 15, the negative electric terminal 16, and the signal terminals 17 extend outside it and the major surfaces of the heat spreaders 13 and 14 exposed outside it. Among the parts of the resin mold assembly 20, only the body 21 made of thermosetting resin encapsulates the components of the resin molded package 10 in a watertight form. The body 21 made of thermosetting resin is of a rectangular shape and has two long side surfaces from one of which the positive electric terminal 15 and the negative electric terminal 16 extend and from the other of which the control terminals 16 extend. The body 21 made of thermosetting resin in which the components of the resin molded package 10 are disposed is usually referred to as a power card which is suitable for being reused.

The shell 22 is made of thermoplastic resin, for example, polyphenylene sulfide (PPS), polybutylene terephthalate, or nylon, polyethylene, or polypropylene resin and covers the periphery of the body 21 made of thermosetting resin so as to expose the ends of the positive electric terminal 15, the negative electric terminal 16, and the signal terminals 17 and the surfaces of the heat spreaders 13 and 14. The shell 22 made of thermoplastic resin is formed as a frame of the resin mold assembly 20 and has formed therein rectangular windows 22a and 22b, as illustrated in FIG. 2(b), from which the surfaces of the heat spreaders 13 and 14 are exposed to the outside of the resin molded package 10.

The shell 22 made of thermoplastic resin, as illustrated in FIG. 1, defines a portion of a coolant path 30 working as a cooling mechanism through which cooling medium or refrigerant flows to cool the semiconductor module 1. Specifically, the shell 22 made of thermoplastic resin is made of an enclosed oval plate with long side surfaces extending in parallel to the long side surfaces of the body 21 made of thermosetting resin. The shell 22 made of thermoplastic resin has oval holes 22c and recesses 22d formed therein. The holes 22c are located in portions of the shell 22 made of thermoplastic resin which lie, as clearly illustrated in FIG. 2(a), outside the opposed ends of the body 21 made of thermosetting resin and define the portion of the coolant path 30. The recesses 22d are formed in the opposed major surfaces of the shell 22 made of thermoplastic resin. The recesses 22d also define, as can be seen from FIG. 1, a portion of the coolant path 30. Specifically, when the resin molded packages 10 are, as illustrated in FIG. 1, stacked on top of another, the holes 22c and the recesses 22d of the blocks 22 made of thermoplastic resin complete the coolant path 30.

The shell 22 made of thermoplastic resin has formed in the peripheral edge thereof a seal mount groove 22e which extends around the recess 22d and in which an O-ring 42, as illustrated in FIGS. 1, 2(b), and 2(c), is inserted. When the resin molded packages 10 are, as illustrated in FIG. 1, stacked on top of another, the O-rings 42 for each of the resin molded packages 10 will be pressed against the adjacent resin molded package 10 to create a watertight seal therebetween which avoids the leakage of coolant flowing through the coolant path 30 to the outside of the resin mold assemblies 20.

The semiconductor module 1 also includes, as illustrated in FIG. 1, an upper cover 40, a lower cover 41, and dampers 43.

The upper cover 40 and the lower cover 41 are, as can be seen from FIG. 1, disposed on opposed ends of a stack of the resin molded package 10. The cover 40 is made of a plate shaped to conform to the contour of the resin mold assembly 20 of each of the resin molded packages 10. When the cover 40 is placed on the end of the stack of the resin molded packages 10, an air gap is created between the second surface of the cover 40 and the recess 22d of an uppermost one of the resin molded packages 10. The lower cover 41 is made of a plate contoured to conform with the contour of the resin mold assembly 20 of each of the resin molded package 10 and equipped with two pipes 41a and 41b. The pipes 41a and 41b extend substantially perpendicular to the lower cover 41 and communicate with the holes 22c of the resin molded packages 10 which are aligned to define the coolant path 30. The pipe 41a serves as a coolant inlet, while the pipe 41b serves as a coolant outlet. The lower cover 41 also has formed therein a seal mount groove 41c in which the O-ring 42 is fit.

The O-rings 42 are fit in the seal mount holes 22e of the resin molded packages 10 and the seal mount holes 41c of the lower cover 41 to develop hermetical seals between every adjacent two of the resin molded packages 10 and between the resin molded packages 10 and the upper and lower covers 40 and 41.

The clampers 43 function as fastener to firmly join the upper and lower covers 40 and 41 and a stack of the resin molded packages 10 in which the O-rings 42 are disposed in the grooves 22e and 41c to complete the semiconductor module 1. Specifically, each of the dampers 43, as can be seen in FIG. 1, clamps the upper and lower covers 40 and 41 to hold the assembly of the upper and lower cover 40 and 41 and the stack of the resin molded packages 10 tightly, thereby completing the coolant path 30 within the semiconductor module 1. Such an assembly will also be referred to as a module assembly below. The dampers 43 are detachable for disassembling the upper and lower covers 40 and 41 and the resin molded packages 10. Each of the dampers 43 has hooks formed at ends thereof. The interval between the hooks is smaller than the thickness of the module assembly of the upper and lower covers 40 and 41 and the stack of the resin molded packages 10, so that the hooks of each of the clampers 43 may clamp the upper and lower covers 40 and 41 elastically. Each of the clampers 43 may alternatively be designed to hold the module assembly using screws instead of the hooks.

The use of the O-rings 42 in the semiconductor module 1 constructed, as described above, creates the hermetic seals among the resin molded packages 10, the upper cover 40, and the lower cover 41, thus avoiding the leakage of the coolant from the coolant path 30 and ensuring a required degree of cooling the power semiconductor chips 11 of the resin molded packages 10. The heat spreaders 13 and 14 are equipped with the fin heat sinks 18 and 19 which are disposed in direct contact with the coolant flowing in the branch paths 33, thereby resulting in an increase in area of the heat spreaders 13 and 14 from which the heat is to be radiated or transferred to the coolant.

Specifically, the pipe 41a and one of the two holes 22c of the respective resin molded packages 10, as illustrated in FIG. 1, define an inlet flow path 31, while the pipe 41b and the other hole 22c of the respectively resin molded packages 10 define an outlet flow path 32. The recess 22d formed in the surface of each of the resin molded packages 10 define a branch path 33. The coolant (e.g., water) enters the pipe 41a, flows through the inlet flow path 31, diverges into the branch paths 33, and then discharges from the outlet flow path 32 through the pipe 41b. The coolant flows in direct contact with the heat spreaders 13 and 14 (i.e., the fin heat sinks 18 and 19) within the branch paths 33 and cools them, so that the heat, as generated by the power semiconductor chips 11, will be absorbed by the coolant.

The production method of the semiconductor module 1 will be described below with reference to FIGS. 4(a) to 5(c).
Step in FIG. 4(a)

The heat spreader 13 with a lead frame in which the positive electric terminal 15, the negative electric terminal 16, and the signal terminals 17 are disposed in place is prepared. The power semiconductor chip 11 on which the semiconductor power device such an IGBT and/or an FWD is fabricated is soldered to the surface of the heat spreader 13. Afterwards, the pads formed on the surface of the power semiconductor chip 11 which connect with, for example, the gate of the IGBT are joined to the signal terminals 17 through the bonding wires 17a. Solder is put on the surfaces of the metal block 12 and the negative electric terminal 16. The heat spreader 14 with a lead frame is placed on the solder and joined to the metal block 12 and the negative electric terminal 16.
Step in FIG. 4(b)

The components of the resin molded package 10 which are connected together in the above manner are put in, for example, a transfer mold of a transfer molding machine. Thermosetting resin such as epoxy resin is injected into the transfer mold to form the body 21 made of thermosetting resin, thereby making the power card, as described above. The power card may have the outer major surfaces of the heat spreaders 13 and 14 exposed to the outside, however, is shaped in this embodiment to enclose the heat spreader 14 fully. The lead frames may be cut in this step.

The surface of each of the heat spreaders 13 and 14 may be inclined from a desired horizontal level due to dimension errors and/or assembling errors of the components such as the power semiconductor chip 11, the metal block 12, the heat spreaders 13 and 14, etc., thus resulting in nonparallel orientation between the heat spreaders 13 and 14. Therefore, in the case where either of the outer surfaces of the heat spreaders 13 and 14 is exposed directly from the body 21 made of thermosetting resin, when the heat spreaders 13 and 14 are pressed inwardly by upper and lower mold plates to form the body 21 made of thermosetting resin, it may result in local exertion of pressure on the heat spreaders 13 and 14, which causes damage to the power semiconductor chip 11 or the solder layers. In order to avoid this problem at least one of the heat spreaders 13 and 14 (i.e., the heat spreader 14 in this embodiment) is covered with, that is, embedded in the body 21 made of thermosetting resin.
Step in FIG. 4(c)

A portion of the body 21 made of thermosetting resin with which the outer surface of the heat spreader 14 is covered is removed by cutting or grinding it using a flattering machine to expose the outer surface of the heat spreader 14 outside the body 21 made of thermosetting resin. Simultaneously or subsequently, the outer surfaces of the heat spreaders 13 and 14 are also machined or removed until they are in parallel to each other, in other words, lie flush with the given horizontal level, thereby compensating for the inclination of the heat spreader 13 or 14 due to the dimensional or assembling errors of the components thereof. The surface of an outermost one of the components of each of the heat spreaders 13 and 14 (i.e., the metal film 13c or 14c) is necessarily machined. The thickness of the metal films 13c and 14c is, therefore, so determined as to cover the entire surfaces of the insulating films 13b and 14b even after the outer surfaces of the heat spreaders 13 and 14 are machined and oriented substantially parallel to each other.

Specifically, the firm welding of the fin heat sinks 18 and 19 to the bodies of the heat spreaders 13 and 14 requires the need for the metal films 13c and 14c to be left over the entire surfaces of the insulating films 13b and 14b, respectively. The thickness of the metal films 13c and 14c is, therefore, selected to be greater than a maximum error of height of the surfaces of the heat spreaders 13 and 14 arising from a maximum accumulated dimensional or assembling error of the components thereof.

Each of the heat spreaders 13 and 14 is of a three-layer structure made up of one of the metal plates 13a and 14a, one of the insulating films 13b and 14b, and one of the metal films 13c and 14c, however, FIGS. 4(d), 4(e), and 5(a) to 5(c) simplistically show the heat spreaders 13 and 14 for the brevity of illustration.
Step in FIG. 4(d)

The power card formed by the body 21 made of thermosetting resin into which the above components are resin-molded is put in another mold. Thermoplastic resin such as polyphenylene sulfide is injected into the mold to form the shell 22 made of thermoplastic resin.

Step in FIG. 4(e)

The fin heat sinks 18 and 19 are attached by the ultrasonic welding to the surfaces of the heat spreaders 13 and 14 which are exposed outside the body 21 made of thermoplastic resin.

Specifically, the sub-assembly, as produced by the steps of FIGS. 4(a) to 4(d), is secured at a bottom surface thereof (i.e., the outer surface of the heat spreader 13) to a stage (i.e., a table) of an ultrasonic welding machine. Next, the fin heat sink 19 is placed on the upper surface (i.e., the outer surface of the heat spreader 14) of the sub-assembly. A welding tool which is shaped to conform with the contour of the fin heat sink 19 is positioned to the fin heat sink 19. The ultrasonic welding machine then applies pressure to the welding tool to press the fin heat sink 19 against the heat spreader 14 and welds the fin heat sink 19 to the metal film 14c in the known ultrasonic welding manner.

Subsequently, the sub-assembly is removed from the ultrasonic welding machine, turned upside down, and placed at the upper surface thereof (i.e., the fin heat sink 19) on the table of the ultrasonic welding machine. Specifically, the fin heat sink 19 is secured firmly to the table of the ultrasonic welding machine. Next, the fin heat sink 18 is put on the heat spreader 13 and then welded to the metal film 13c, thereby completing the resin molded package 10.

Step in FIG. 5(a)

A plurality of the resin molded packages 10 each of which has been produced in the steps of FIGS. 4(a) to 4(e) are prepared. For example, the three resin molded packages 10 are prepared. The O-rings 42 are fitted in the grooves 22e of the shells 22 of the resin molded packages 10 and placed to overlap each other to make a packages stack.

Step in FIG. 5(b)

The upper and lower covers 40 and 41 are prepared. The O-ring 42 is fitted in the seal mount groove 41c of the lower cover 41. The upper cover 40 is place on one of opposed ends of the package stack, while the lower cover 41 is placed on the other end of the package stack. Such an assembly will also be referred to as a module assembly below.

Step in FIG. 5(c)

The package stack and the upper and lower cover 40 and 41 which are assembled in the above steps are retained tightly by the clamps 43 to complete the semiconductor module 1, as illustrated in FIG. 1.

As apparent from the above discussion, the semiconductor module 1 of this embodiment is made up of a stack of the resin molded package 10. Note that semiconductor module 1 may alternatively be designed to have only one semiconductor unit 1. The semiconductor unit 1 is equipped with the heat spreaders 13 and 14. The heat spreader 13 includes two discrete parts: the body of the heat spreader 13 and the fin heat sink 18. The body of the heat spreader 13 is made by an assembly of the metal plate 13a, the insulating film 13b, and the metal film 13c. The fin heat sink 18 is joined or welded to the surface of the body of the heat spreader 13. The insulating film 13b serves to avoid the leakage of electricity from inside to outside the heat spreader 13. The fin heat sink 18 is formed separately from the body of the heat spreader 13, thus facilitating ease of machining the fin heat sink 18 to have a complex shape. The same is true for the heat spreader 14 and the fin heat sink 19.

In the case where, for example, the fin heat sink 18 and the heat spreader 13 are formed by a one-piece member, a molding tool which is shaped to have holes into which the fins of the fin heat sink 18 are to be inserted needs to be used in order to keep resin from entering between the fins of the fin heat sink 18 during the molding of the body 21 made of thermosetting resin. The use of such a molding tool results in a difficulty in positioning the fins of the fin heat sink 18 relative to the holes of the molding tool and leads to a concern about undesirable deformation, breakage, or contamination of the fins of the fin heat sink 18. Additionally, a variation in height of the fins of the fin heat sink 18 may result in undesirable inclination of the sub-assembly, for example, when the shell 22 made of thermoplastic resin is molded.

The structure of the heat spreaders 13 and 14 of this embodiment permits the resin molded package 10 to be formed in a simplified manner and eliminates the above problems.

The semiconductor module 1 according to the second embodiment will be described below which is different in structure of the resin molded package 10 to ensure high-precision positioning of the heat spreaders 13 and 14 from that of the first embodiment. Other arrangements are identical, and explanation thereof in detail will be omitted here.

Figure 6A:
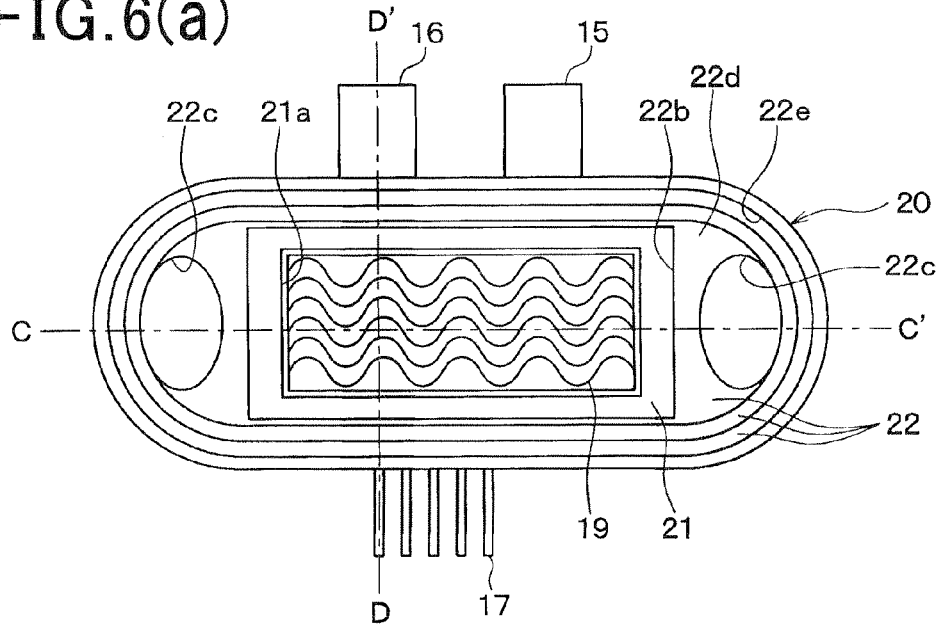
FIG. 6(a) is a plane view which shows one of resin molded packages built in a semiconductor module of the second embodiment.
Figure 6B:
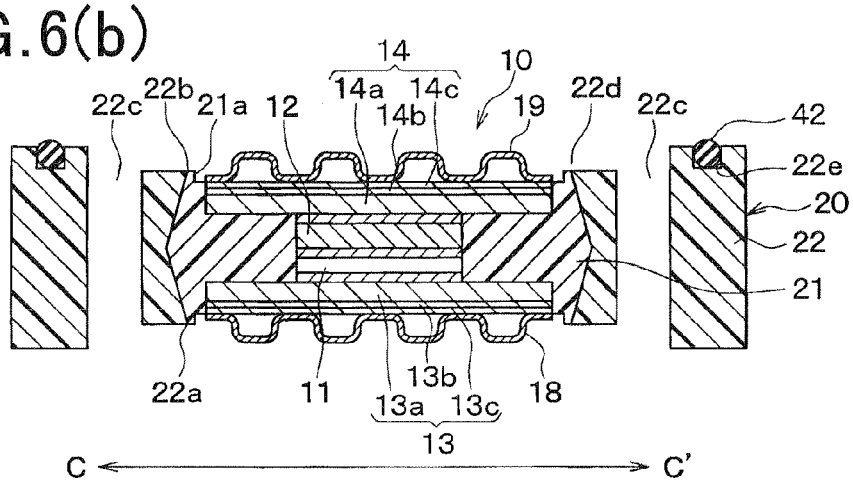
FIG. 6(b) is a cross sectional view, as taken along the line C-C' of FIG. 6(a)
Figure 6C:
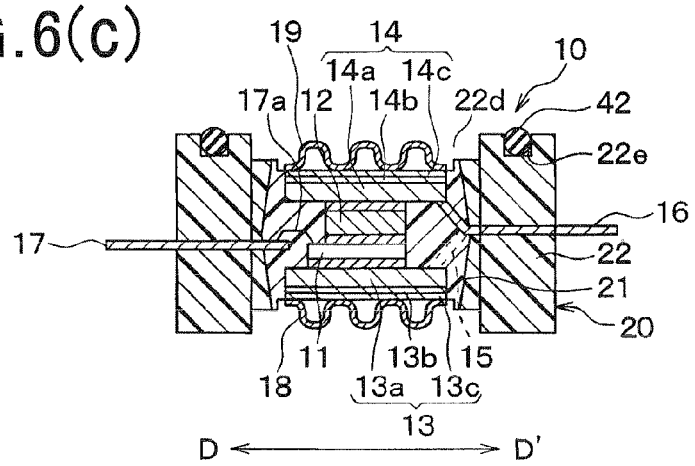
FIG. 6(c) is a cross sectional view, as taken along the line D-D' of FIG. 6(a)

FIGS. 6(a) to 6(c) illustrate the structure of the resin molded package 10 of the second embodiment. FIG. 6(a) is a front view of the resin molded package 10. FIG. 6(b) is a cross sectional view, as taken along the line C-C' of FIG. 6(a). FIG. 6(c) is a cross sectional view, as taken along the line D-D' of FIG. 6(a).

Specifically, the body 21 made of thermosetting resin has, as can be seen from FIG. 6(a), a rectangular positioning recess or shoulder 21a formed in each of the opposed major surfaces thereof. Each of the positioning shoulders 21a extends just around the circumference of a corresponding one of the heat spreaders 13 and 14. In other words, an inner edge of each of the positioning shoulders 21a is shaped to conform with the contour of the circumferential edge of one of the heat spreaders 13 and 14. The positioning shoulders 21a are slightly greater in size than the heat spreaders 13 and 14. When, for example, the fin heat sink 19 is placed on the body of the heat spreader 14 to be welded thereto, the positioning shoulders 21a works to position or guide the placement of the fin heat sink 19 onto the metal film 14c. The same is true for the heat sink 18.

Instead of the positioning shoulders 21a, the opposed surfaces of the body 21 made of thermosetting resin may alternatively extend stepwise, in other words, may be oriented not to lie flush with the opposed surfaces of the shell 22 made of thermoplastic resin to define rectangular shoulders. The outer edges of the windows 22a and 22b, therefore, work, like the positioning shoulders 21a.

The semiconductor module 1 according to the third embodiment will be described below which is different in welding of the fin heat sinks 18 and 19 to the bodies of the heat spreaders 13 and 14 from that of the first embodiment. Other arrangements are identical, and explanation thereof in detail will be omitted here. The following discussion will refer only to the heat spreader 14 for the brevity of disclosure.

Figure 7:
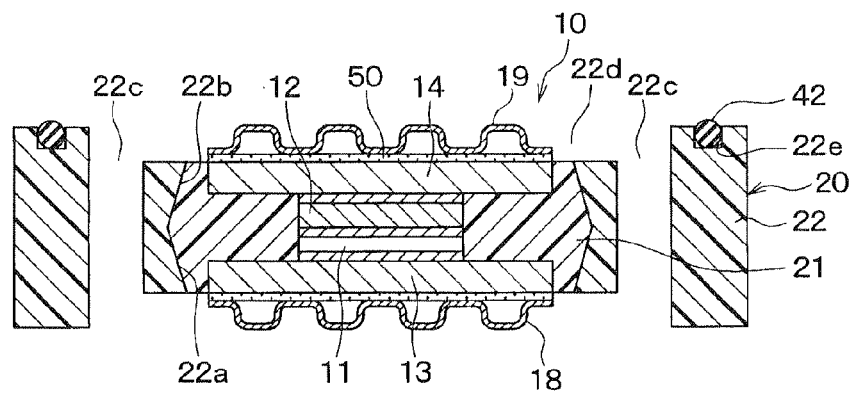
FIG. 7 is a cross sectional view of a resin molded package of the third embodiment.

FIG. 7 is a transverse sectional view, as taken along the same line as in FIG. 2(b), which illustrates the internal structure of the resin molded package 10 of the third embodiment.

Specifically, the body of the heat spreader 14 of this embodiment is, as clearly illustrated in the drawing, made only of a metal plate, like the metal plate 14a. The fin heat sink 19 is glued directly to the outer surface of the body of the heat spreader 14 through an adhesive layer 50. The adhesive layer 50 may be provided with electric conductivity as well as thermal conductivity, either in the form of adhesive paste or adhesive sheet material. The attaching of the fin heat sink 19 to the heat spreader 14 is achieved by applying the adhesive layer 50 over the outer surface of the body of the heat spreader 14 of the sub-assembly, as produced in steps of FIGS. 4(a) to 4(d), and attaching the fin heat sink 19 to the adhesive layer 50. The attaching of the fin heat sink 18 to the heat spreader 13 is the same as that of the fin heat sink 19 to the heat spreader 14, and explanation thereof in detail will be omitted here.

The body of the heat spreader 14 of this embodiment is, as described above, made only of a metal plate, like the metal plate 14a, however, may include the insulating film 14b.

When the material of, for example, the fin heat sink 19 is different from that of body of the heat spreader 14, a change in temperature thereof will cause thermal stress to be exerted on the adhesive layer 50. In order to minimize such thermal stress, the fin heat sink 19 and the body of the heat spreader 14 are preferably made of the same material. The use of the adhesive layer 50 eliminates the need for the ultrasonic-welding of the fin heat sink 19 to the heat spreader 14, thus eliminating the need for the metal film 14. The electric insulation of the fin heat sink 19 from the body of the heat spreader 14 may be achieved by making the adhesive layer 50 of an insulating material. The adhesive layer 50, thus, works as the insulating film 14b, thus eliminating the need for attaching the insulating film 14b to the metal plate. The same applies to the fin heat sink 18 and the heat spreader 13.

The semiconductor module 1 according to the fourth embodiment will be described below which is different in layout of fins 18b and 19b of the fin heat sinks 18 and 19 from that of the first embodiment. Other arrangements are identical, and explanation thereof in detail will be omitted here.

Figure 8A:
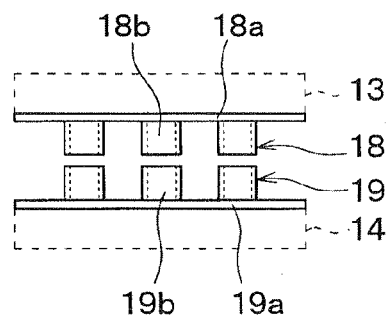
FIG. 8(a) is a side view which illustrates fins of fin heat sinks of a resin molded package of the forth embodiment.
Figure 8B:
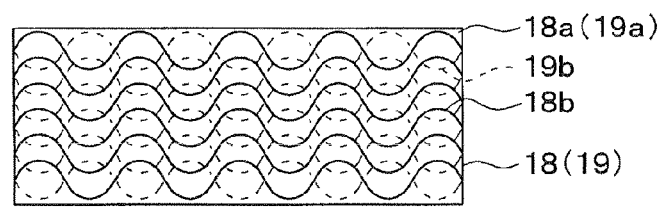
FIG. 8(b) is a schematic illustration of layouts of the fins in FIG. 8(a)

FIGS. 8(a) and 8(b) illustrate the fin heat sinks 18 and 19 of adjacent two of the resin molded packages 10 of the semiconductor module 1. FIG. 8(a) is a side view of the fins 18b and 19b disposed within the branch path 33 between adjacent two of the resin molded packages 10, as viewed from the right side of FIG. 1. FIG. 8(b) is a schematic illustration of layouts of the fins 18b and 19b of the fin heat sinks 18 and 19, as viewed from the top of FIG. 1. FIGS. 8(a) and 8(b) are, like FIGS. 2(a) to 2(c), different in number of the corrugations from each other for the brevity of illustration.

The fin heat sink 18 is, like in the first embodiment, made up of a plurality of fins 18b which extend parallel to the flow of the coolant within the branch path 33 (i.e., a direction perpendicular to a direction in which the resin molded packages 10 are stacked). Similarly, the fin heat sink 19 is made up of a plurality of fins 19b which extend parallel to the flow of the coolant within the branch path 33. FIG. 8(b) shows each of the heat spreaders 13 and 14 as having the six fins 18b or 19b, however, FIG. 8(a) shows each of the heat spreaders 13 and 14 as having the three fines 18b or 19b for the brevity of illustration. The fins 18b of the fin heat sink 18 of each of the resin molded packages 10 are, as clearly illustrated in FIGS. 8(a), aligned with the fins 19b of the fin heat sink 19 of an adjacent one of the resin molded package 10 in the thickness-wise direction of the resin molded package 10. The fins 18b are, as can be seen from FIG. 8(b), arrayed 180° out of phase with the fins 19b. In other words, the corrugations of the fins 18b are located 180° out of phase with those of the fins 19b in the direction of the flow of the coolant in the branch path 33. The tips (i.e., ridges) of the fins 18b are located at a given interval away from the tips (i.e., ridges) of the fins 19b.

The above described 180° out-of-phase layouts of the fins 18b and 19b of the fin heat sinks 18 and 19 create lots of turbulent or eddy flows of the coolant within each of the branch paths 33 of the semiconductor module 1, thus enhancing the cooling performance of the heat spreaders 13 and 14. Note that the fins 18b may be positioned out of phase with the fins 19b by an angle other than 180 °.

The semiconductor module 1 according to the fifth embodiment will be described below which is different in structure of the fin heat sinks 18 and 19 from that of the first embodiment. Other arrangements are identical, and explanation thereof in detail will be omitted here.

Figure 9A:
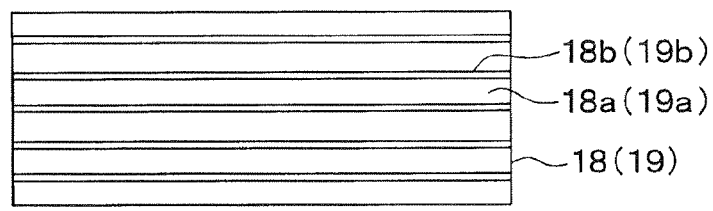
FIG. 9(a) is a plane view of fin heat sinks of adjacent two of resin molded packages according to the fifth embodiment.
Figure 9B:
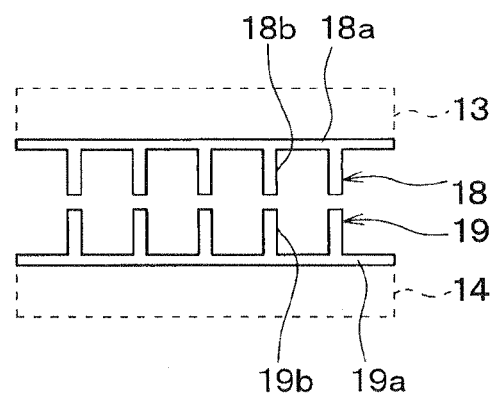
FIG. 9(b) is a side view of FIG. 9(a)

FIGS. 9(a) and 9(b) illustrate the fin heat sinks 18 and 19 of adjacent two of the resin molded packages 10 of the semiconductor module 1. FIG. 9(a) is a plane view of the fin heat sink 18. FIG. 9(b) is a side view of the fins 18b and 19b extending within the branch path 33 between adjacent two of the resin molded packages 10, as viewed from the right side of FIG. 1.

Each of the fin heat sinks 18 and 19 made of a flat plate and an array of straight strips extending perpendicular to the flat plate to define the fins 18b. The fins 18b also extend parallel to each other (i.e., parallel to the flow of the coolant in the branch path 33) to define the flat surface areas 18a therebetween and outside outermost two of the fins 18b. Each of the fins 18b of the fin heat sink 18 of one of the resin molded packages 10, as can be seen from FIG. 9(b), faces one of the fins 19b of the fin heat sink 19 of an adjacent one of the resin molded packages 10 in alignment with one another in the thickness-wise direction of the resin molded packages 10. Top ends of the fins 18b are located at a given interval (i.e., air gap) away from those of the fins 19b.

Figure 10:
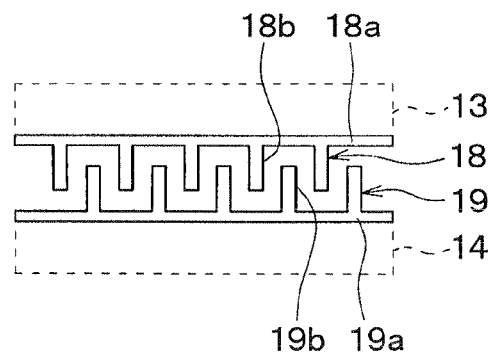
FIG. 10 is a side view which illustrates fin heat sinks of adjacent two of resin molded packages according to the sixth embodiment.

FIG. 10 illustrates the fin heat sinks 18 and 19 according to the sixth embodiment which is a modification of the fifth embodiment. FIG. 10 is a side view of the fins 18b and 19b extending within the branch path 33 between adjacent two of the resin molded packages 10, as viewed from the right side of FIG. 1.

Each of the fins 18b and 19b has a height greater than that in the fifth embodiment of FIGS. 9(a) and 9(b). Specifically, the fins 18b are, as can be seen from the drawing, arrayed out of alignment with the fins 19b in the thickness-wise direction of the resin molded package 10 (i.e., a direction in which the resin molded packages 10 are laid to overlap each other as the package stack). In other words, the fins 18b are staggered relative to the fins 19b so that the fins 18b partially overlap the fins 19b in a direction perpendicular to the direction of the flow of the coolant in the branch path 33 (i.e., a direction perpendicular to the length of the fins 18b and 19b). This layout of the fins 18b and 19b serves to create highly turbulent eddy flows of the coolant within each of the branch paths 33 of the semiconductor module 1, thus enhancing the cooling performance of the heat spreaders 13 and 14.

The semiconductor module 1 according to the seventh embodiment will be described below which is different in structure of the fin heat sinks 18 and 19 from that of the first embodiment. Other arrangements are identical, and explanation thereof in detail will be omitted here.

Figure 11A:
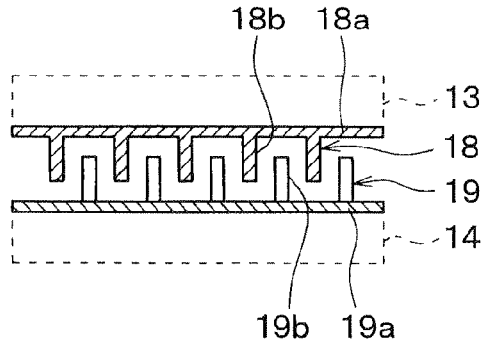
FIG. 11(a) is a cross sectional view, as taken along the line E-E' in FIG. 11(b), which illustrates fin heat sinks of adjacent two of resin molded packages according to the seventh embodiment.
Figure 11B:
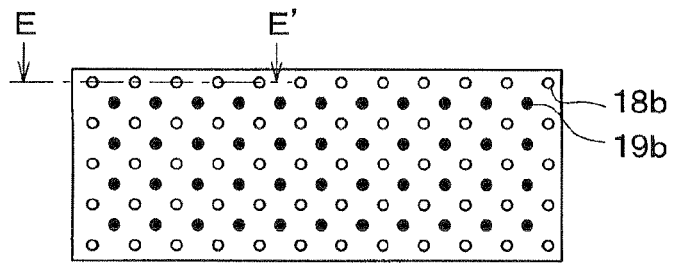
FIG. 11(b) is a plane view which illustrates a layout of the fin heat sinks of FIG. 11(a)

FIGS. 11(a) and 11(b) illustrate the fin heat sinks 18 and 19 of adjacent two of the resin molded packages 10 of the semiconductor module 1. FIG. 11(a) is a cross sectional view, as taken along the line E-E' in FIG. 11(b). FIG. 11(b) is a plane view which illustrates a layout of the fin heat sinks 18 and 19. White circles indicate the fins 18b of the fin heat sink 18, while black circles indicate the fins 19b of the fin heat sink 19.

Each of the fin heat sinks 18 and 19 is of a pin type. Specifically, each of the fin heat sinks 18 and 19 is made up of a flat plate and a matrix of pins protruding perpendicular to the flat plate to define the fins 18b. An area of the flat plate other than the fins 18b or 19b is the flat surface area 18a or 19a.

The fins 18b are, as illustrated in FIG. 11(b), arranged in, for example, five arrays (columns) extending parallel to the flow of the coolant in the branch path, while the fins 19b are arrayed in, for example, four arrays. Additionally, the fins 18b are also arranged in, for example, twelve arrays (rows) extending perpendicular to the flow of the coolant in the branch path, while the fins 19b are arrayed in, for example, eleven arrays (rows). These arrangements define a matrix layout of the fins 18b and 19b in which each of the fins 19b is located at the middle of every surrounding four of the fins 18b. In other words, the fins 18b are staggered relative to the fins 19b in vertical and lateral directions, as viewed in FIG. 11(b).

The height of the fins 18b and 19b is so selected that the fins 18b and 19b partially overlap one another in the direction of the flow of the coolant, as viewed in FIG. 11(a). The fins 18b and 19b do not physically interfere with one another, in other words, tops of the fins 18b are located at a given interval (i.e., an air gap) away from those of the fins 19b. These layouts of the fins 18b and 19b serve to create highly turbulent eddy flows of the coolant within each of the branch paths 33 of the semiconductor module 1, thus enhancing the cooling performance of the heat spreaders 13 and 14.

The semiconductor module 1 according to the eighth embodiment will be described below which is different in layout of the fin heat sinks 18 and 19 from that of the seventh embodiment. Other arrangements are identical, and explanation thereof in detail will be omitted here.

Figure 12A:
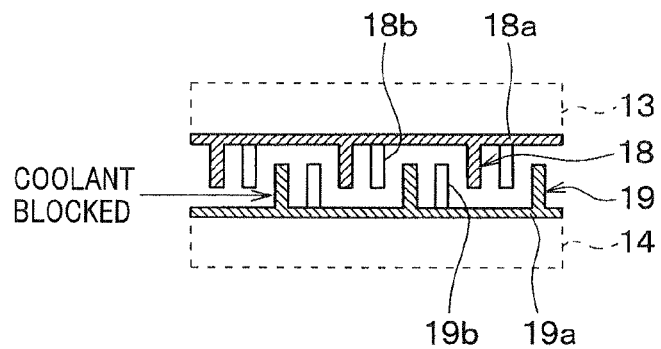
FIG. 12(a) is a cross sectional view, as taken along the line F-F' in FIG. 12(b), which illustrates fin heat sinks of adjacent two of resin molded packages according to the eighth embodiment.
Figure 12B:
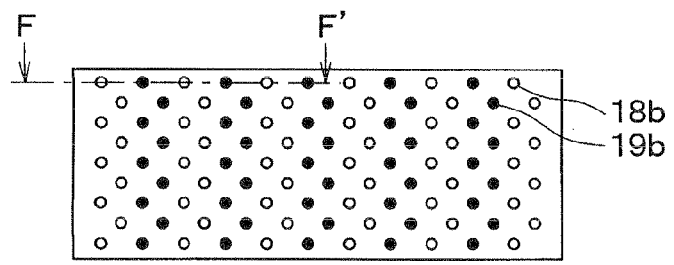
FIG. 12(b) is a plane view which illustrates a layout of the fin heat sinks of FIG. 12(a)

FIGS. 12(a) and 12(b) illustrate the fin heat sinks 18 and 19 of adjacent two of the resin molded packages 10 of the semiconductor module 1. FIG. 12(a) is a cross sectional view, as taken along the line F-F' in FIG. 12(b). FIG. 12(b) is a plane view which illustrates a layout of the fin heat sinks 18 and 19. White circles indicate the fins 18b of the fin heat sink 18, while black circles indicate the fins 19b of the fin heat sink 19.

Each of the fin heat sinks 18 and 19 is, like in the seventh embodiment, of a pin type.

The fins 18b are, as illustrated in FIG. 12(b), arranged in six pairs of arrays extending perpendicular to the flow of the coolant in the branch path, while the fins 19b are arrayed in, for example, five pairs of arrays extending parallel to the arrays of the fins 18b. The six pairs of arrays of the fins 18b and the five pairs of arrays of the fins 19b are, as can be seen in FIG. 12(b), interleaved alternately in the direction of the flow of the coolant. In other words, the fins 18b and 19b lie alternately along each of lines extending parallel to the flow of the coolant.

In the layouts of the fins 18b and 19b of FIGS. 11(a) and 11(b), each of the pin arrays extending parallel to the flow of the coolant is made up of only either of the fins 18b or the fins 19b. The tops of the fins 18b of one of the resin molded package 10 are, as described above, located away from the flat plate (i.e., the flat surface area 19a) of the fin heat sink 19 of an adjacent one of the resin molded package 10 through the gap. The gap, thus, defines a flow path along which the coolant will flow within the branch path 33. The same is true for the arrays of the fins 19b.

In the layouts of the fins 18b and 19b of this embodiment, each of the pin arrays extending parallel to the flow of the coolant is made up of the fins 18b and 19b lying alternately. In other words, each of flows of the coolant along the pin arrays will be, as indicated by an arrow in FIG. 12(a), disrupted or blocked by either of the fins 18b or 19b. This ensures the formation of the turbulent or eddy flows of the coolant within each of the branch paths 33 of the semiconductor module 1, thus further enhancing the cooling performance of the fin heat sinks 13 and 14.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

For example, the body 21 and the shell 22 may be both made of either of thermosetting resin or thermoplastic resin. It is, however, advisable that the body 21 in which the power semiconductor chip 11, etc., is embedded be made of thermosetting resin in terms of the thermal endurance. Alternatively, in order to permit the shell 22 to be softened at relatively low temperatures and removed for reuse of the resin molded package 10, the shell 22 is preferably made of thermoplastic resin.

The semiconductor module 1 has been described as being used in the inverter for driving the three-phase electric motor, but may alternatively be used with other types of electrical devices.

Figure 13:
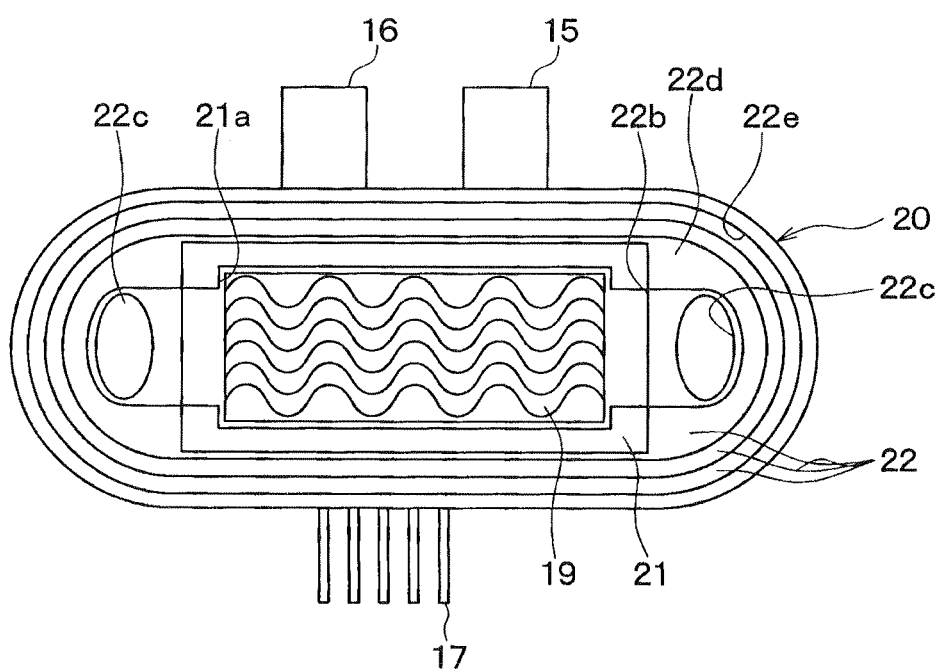
FIG. 13 is a plane view which shows a modification of the resin molded package, as illustrated in FIGS. 6(a) to 6(c).

FIG. 13 shows a modification of the structure of the resin molded package 10 of the second embodiment, as illustrated in FIGS. 6(a) to 6(c).

The body 21 of the second embodiment has the positioning shoulder 21a formed in each of the opposed major surfaces thereof. The whole of the upright wall of each of the positioning shoulders 21a faces one of the fin heat sinks 18 and 19. The positioning shoulders 21a may be designed to have another configuration. In the modification of the resin molded package 10 of FIG. 13, each of the positioning shoulders 21a is shaped to have opposed side walls which at least partially extend around the holes 22c defining the coolant path 30. The other side walls of the positioning shoulder 21a extend parallel to the length of the fin heat sink 18 or 19. This configuration of each of the positioning shoulders 21a also serves to guide the placement of a corresponding one of the fin heat sinks 18 and 19 on the body of the heat spreader 13 or 14.

The coolant flowing through the coolant path 30 may be water or another type of cooling medium. Each of the fin heat sinks 18 and 19 may alternatively be of another typical corrugated type or flared type.

The semiconductor module 1 may be made to include the only one resin molded package 10 which is retained tightly between the upper and lower covers 40 and 41 through the clampers 43.

What is claimed is:

1. A semiconductor module comprising:
a plurality of resin molded packages each of which includes a resin mold, the resin molded packages being laid to overlap each other as a package stack, the resin mold having embedded therein a power semiconductor chip which has a first and a second surface opposed to each other and on which a semiconductor power device is fabricated, a first heat spreader, a second heat spreader, and electric terminals coupled electrically with the semiconductor power device, the first heat spreader having a first surface and a second flat surface opposed to the first surface and being disposed at the first surface thereof in connection with the first surface of the semiconductor chip, the second heat spreader having a first surface and a second flat surface opposed to the first surface and being disposed at the first surface thereof in connection with the second surface of the power semiconductor chip, a portion of each of the electric terminals being exposed outside the resin mold, the resin mold also having formed therein a coolant path that is a portion of a coolant path through which a coolant flows to cool the power semiconductor chip;

first and second insulating films disposed over the second flat surfaces of the first and second heat spreaders of each of the resin molded packages, respectively;

first and second fin heat sinks joined to the first and second insulating films of each of the resin molded packages, respectively, so that adjacent two of the resin molded packages are arranged to have the first and second fin heat sink facing one another;

a first cover disposed on a first surface of the package stack;

a second cover disposed on a second surface of the package stack; and a fastener which fastens the first and second covers to hold the package stack, wherein each of the first and second fin heat sinks is equipped with corrugated fins, wherein the fins of the first fin heat sink of one of adjacent two of the resin molded packages are arrayed 180° out of phase with the fins of the second fin heat sink of the other of adjacent two of the resin molded packages, wherein tops of the fins of the first fin heat sink of one of adjacent two of the resin molded packages are located away from those of the fins of the second fin heat sink of the other of adjacent two of the resin molded packages through a gap, and wherein the fins of the first fin heat sink and the fins of the second fin heat sink are configured to generate a turbulent or eddy flow of the coolant.

2. A semiconductor module as set forth in claim 1, wherein the first heat spreader has a first metal plate disposed on the semiconductor chip, the first insulating film disposed on a surface of the first metal plate that is the second surface of the first heat spreader, and a first metal film disposed on the first insulating film away from the first metal plate, wherein the second heat spreader has a second metal plate disposed on the semiconductor chip, the second insulating film disposed on a surface of the second metal plate that is the second surface of the second heat spreader, and a second metal film disposed on the second insulating film and electrically kept away from the second metal plate, and wherein the first and second fin heat sinks are welded to the first and second metal films, respectively.

3. A semiconductor module as set forth in claim 1, wherein the fins are arrayed so that they are corrugated, as viewed in a direction perpendicular to the second flat surface of each of the first and second heat spreaders.

4. A semiconductor module as set forth in claim 1, wherein the fins are arrayed so that they are also corrugated, as viewed on two planes which extend perpendicular to the second flat surface of each of the first and second heat spreaders and perpendicular to each other.

* * * * *